United States Patent
Wang et al.

(10) Patent No.: US 12,231,124 B2
(45) Date of Patent: *Feb. 18, 2025

(54) HIERARCHICAL STATISICALLY MULTIPLEXED COUNTERS AND A METHOD THEREOF

(71) Applicant: Marvell Asia Pte, Ltd., Singapore (SG)

(72) Inventors: Weihuang Wang, Los Gatos, CA (US);
Gerald Schmidt, San Jose, CA (US);
Srinath Atluri, Fremont, CA (US);
Weinan Ma, San Jose, CA (US);
Shrikant Sundaram Lnu, San Jose, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/500,091

(22) Filed: Nov. 1, 2023

(65) Prior Publication Data

US 2024/0063800 A1    Feb. 22, 2024

Related U.S. Application Data (60) Division of application No. 17/591,546, filed on Feb. 2, 2022, now Pat. No. 11,843,378, which is a
(Continued)

(51) Int. Cl.
*H03K 21/00* (2006.01)
*H03K 21/02* (2006.01)
(Continued)

(52) U.S. Cl.
CPC ........... *H03K 21/026* (2013.01); *H03K 23/64* (2013.01); *H04L 47/62* (2013.01);
(Continued)

(58) Field of Classification Search
CPC ...... H03K 21/026; H03K 21/00; H03K 21/10; H03K 23/00; H03K 23/004; H03K 23/005; H03K 23/64

See application file for complete search history.

(56) References Cited

U.S. PATENT DOCUMENTS 5,809,174 A    9/1998    Purcell et al.
6,687,325 B1   2/2004    Wells
(Continued)

FOREIGN PATENT DOCUMENTS

CN    101517534 A    8/2009
CN    103347013 A    10/2013
(Continued)

OTHER PUBLICATIONS

Chinese Office Action dated Mar. 18, 2020 for the Chinese Patent Application No. 201680015083.9.
(Continued)

*Primary Examiner* — Tuan T Lam (57) ABSTRACT

Embodiments of the present invention relate to an architecture that uses hierarchical statistically multiplexed counters to extend counter life by orders of magnitude. Each level includes statistically multiplexed counters. The statistically multiplexed counters includes P base counters and S subcounters, wherein the S subcounters are dynamically concatenated with the P base counters. When a row overflow in a level occurs, counters in a next level above are used to extend counter life. The hierarchical statistically multiplexed counters can be used with an overflow FIFO to further extend counter life.

20 Claims, 9 Drawing Sheets

Related U.S. Application Data continuation of application No. 17/070,771, filed on Oct. 14, 2020, now Pat. No. 11,277,138, which is a division of application No. 16/019,780, filed on Jun. 27, 2018, now Pat. No. 10,840,912, which is a division of application No. 15/202,428, filed on Jul. 5, 2016, now Pat. No. 10,038,448, which is a division of application No. 14/302,351, filed on Jun. 11, 2014, now Pat. No. 9,413,357.

(51) Int. Cl.

| | | |
|---|---|---|
| *H03K 23/64* | (2006.01) | |
| *H04L 47/62* | (2022.01) | |
| *H04L 49/90* | (2022.01) | |
| *H03K 21/10* | (2006.01) | |
| *H03K 23/00* | (2006.01) | |

(52) U.S. Cl.
CPC .......... *H04L 49/9084* (2013.01); *H03K 21/00* (2013.01); *H03K 21/10* (2013.01); *H03K 23/00* (2013.01); *H03K 23/004* (2013.01); *H03K 23/005* (2013.01)

(56) References Cited

U.S. PATENT DOCUMENTS

| | | | |
|---|---|---|---|
| 6,831,917 | B1 | 12/2004 | Cheriton |
| 6,895,070 | B2 | 5/2005 | Kobayashi et al. |
| 6,944,256 | B2 | 9/2005 | Smallwood et al. |
| 7,085,229 | B1 | 8/2006 | Potter, Jr. et al. |
| 7,627,870 | B1 | 12/2009 | Michaeli |
| 8,054,744 | B1 | 11/2011 | Bishara et al. |
| 8,064,567 | B2 | 11/2011 | Schmidt |
| 8,189,732 | B1 | 5/2012 | Melton et al. |
| 8,345,816 | B1 | 1/2013 | Adiga et al. |
| 8,761,332 | B2 | 6/2014 | Felten et al. |
| 9,258,277 | B1 | 2/2016 | Zhuang |
| 9,379,963 | B2 | 6/2016 | Tran |
| 9,654,409 | B2 | 5/2017 | Yadav et al. |
| 2004/0213370 | A1 | 10/2004 | Smallwood et al. |
| 2005/0076228 | A1 | 4/2005 | Davis |
| 2005/0193240 | A1 | 9/2005 | Ash |
| 2011/0103504 | A1 | 5/2011 | Ma |
| 2011/0103540 | A1 | 5/2011 | Wassermann |
| 2013/0054897 | A1 | 2/2013 | Flemming et al. |
| 2013/0163475 | A1 | 6/2013 | Beliveau |
| 2014/0086378 | A1* | 3/2014 | Felten .................... H03K 21/38 377/44 |
| 2014/0153443 | A1 | 6/2014 | Carter |
| 2014/0181473 | A1 | 6/2014 | Dice |
| 2014/0181827 | A1 | 6/2014 | Dice |
| 2014/0369363 | A1 | 12/2014 | Hutchison |
| 2015/0172189 | A1 | 6/2015 | Pitchai |
| 2015/0187419 | A1 | 7/2015 | Tran |
| 2016/0028623 | A1 | 1/2016 | Kamath |

FOREIGN PATENT DOCUMENTS

| | | |
|---|---|---|
| CN | 103856405 A | 6/2014 |
| CN | 103959302 A | 7/2014 |
| CN | 104010049 A | 8/2014 |
| CN | 104012063 A | 8/2014 |

OTHER PUBLICATIONS

Notice of Allowance dated Aug. 28, 2020 for the Chinese Patent Application No. 2016800115083.9.

Office Action and Search Report dated Aug. 20, 2018 from Chinese Application No. 201510320187.8.

Notice of Allowance for the Chinese application No. 201510320187.8 dated Sep. 30, 2019.

Office Action and translation for the Taiwanese application No. 104112176.

Office Action dated Aug. 5, 2020 from Chinese Patent Application No. 201510253417.3.

* cited by examiner

HIERARCHICAL STATISICALLY MULTIPLEXED COUNTERS AND A METHOD THEREOF

RELATED APPLICATIONS

This application is a divisional of co-pending application Ser. No. 17/591,546, filed on Feb. 2, 2022, and entitled "HIERARCHICAL STATISTICALLY MULTIPLEXED COUNTERS AND A METHOD THEREOF," which is a continuation of application Ser. No. 17/070,771, filed on Oct. 14, 2020, and entitled "HIERARCHICAL STATISTICALLY MULTIPLEXED COUNTERS AND A METHOD THEREOF," which is a divisional of co-pending application Ser. No. 16/019,780, filed on Jun. 27, 2018, and entitled "HIERARCHICAL STATISTICALLY MULTIPLEXED COUNTERS AND A METHOD THEREOF," which is a divisional of co-pending application Ser. No. 15/202,428, filed on Jul. 5, 2016, and entitled "HIERARCHICAL STATISTICALLY MULTIPLEXED COUNTERS AND A METHOD THEREOF," which is a divisional of application Ser. No. 14/302,351, filed on Jun. 11, 2014, and entitled "HIERARCHICAL STATISTICALLY MULTIPLEXED COUNTERS AND A METHOD THEREOF," all of which are hereby incorporated by reference.

FIELD OF INVENTION

The present invention relates to counters in a high speed network switch. More particularly, the present invention relates to hierarchical statistically multiplexed counters and a method thereof.

BACKGROUND OF THE INVENTION

Statistics counters are used to perform data analytics in a high speed network device. To be useful, an architecture needs to store a large number of counters. Although off-chip DRAM (dynamic random access memory) can be used, it cannot accommodate high speed counter updates. On-chip SRAM (static random access memory) allows for greater speed but is very expensive. Since the memory is one of the most expensive resources in an SOC (system on chip), it is critical to efficiently and flexibly utilize the memory. When dealing with storing multiple counters, there exists a tradeoff between fewer larger counters or more smaller counters. Ideally, each counter is long enough to avoid integer overflow, the wrapping around of the counter. However, in standard practice, this leads to overprovisioning, assigning the worst case number of bits for all counters.

BRIEF SUMMARY OF THE INVENTION

Embodiments of the present invention relate to an architecture that uses hierarchical statistically multiplexed counters to extend counter life by orders of magnitude. Each level includes statistically multiplexed counters. The statistically multiplexed counters includes P base counters and S subcounters, wherein the S subcounters are dynamically concatenated with the P base counters. When a row overflow in a level occurs, counters in a next level above are used to extend counter life. The hierarchical statistically multiplexed counters can be used with an overflow FIFO to further extend counter life.

In one aspect, a counter architecture is provided. The counter architecture is implemented in a network device, such as a network switch. The counter architecture includes a plurality of levels of statistically multiplexed counters. Each of the levels of statistically multiplexed counters includes N counters. In some embodiments, the N counters are wrap-around. The N counters are arranged in N/P rows. Each of the N/P rows includes P base counters and S subcounters, wherein any of the P base counters can be dynamically concatenated with one or more of the S subcounters to flexibly extend the counting capacity. In some embodiments, each of the P base counters initially uses one of the S subcounters. P is typically chosen as a power of two for optimal implementation In some embodiments, the plurality of levels includes at least two levels. In some embodiments, the plurality of levels includes at least three levels.

In some embodiments, each of the N/P rows also includes an overhead, wherein the overhead is an S-bit mapping of the S subcounters to the P base counters. The mapping is updated upon counter expansion and upon counter shrinkage.

In some embodiments, counters in the same row in a first level of the plurality of levels are shuffled into different rows in a second level of the plurality of levels. A randomization of the shuffle is a bit reverse of a counter identifier of a counter, a hash function or a bit arrangement in another order.

In some embodiments, the counter architecture implements a mirrored shift logic, wherein the mirror shift logic includes a lower shift logic and an upper shift logic that is the mirror of the lower shift logic. A subcounter that has a rank <P/2 is associated with the lower shift logic, wherein the lower shift logic shifts the subcounter up. A subcounter that has a rank P/2 is associated with the upper shift logic, wherein the upper shift logic shifts the subcounter down. The rank of a subcounter is related to the assigned positions of previous subcounters to base counters.

In some embodiments, the counter architecture also includes an overflow FIFO used and shared by the N counters in the highest level in the plurality of levels, wherein the overflow FIFO stores associated counter identifiers of all counters that are overflowing along with overflow widths.

In some embodiments, the counter architecture also includes at least one interrupt sent to a CPU to read data in the overflow FIFO and to read and clear data in a counter from each of the plurality of levels.

In another aspect, a counter architecture is provided. The counter architecture is implemented in a network device. The counter architecture includes a hierarchy of levels of statistically multiplexed counters, wherein each of the hierarchy of levels includes a plurality of rows of bits, wherein each row includes a first set of consecutive bits, a second set of consecutive bits and a third set of consecutive bits.

In some embodiments, the first set of consecutive bits is evenly shared by S subcounters, the second set of consecutive bits is evenly shared by P base counters, and the third set of consecutive bits represents a mapping of the S subcounters to the P base counters. A counter is expanded by concatenating one or more of the S subcounters to one of the P base counters. A counter is shrunk by removing one or more of the S subcounters from one of the P base counters.

In some embodiments, when row overflow occurs in one level of the hierarchy occurs, counters in a next level above are used to extend counter life. In some embodiments, counters in the one level of the hierarchy are shuffled into different rows in the next level above of the hierarchy.

The counter architecture also includes an overflow FIFO used and shared by all counters in the highest level in the hierarchy of levels, wherein the overflow FIFO stores associated counter identifiers of any of the counters that are overflowing in the highest level in the hierarchy of levels.

In yet another aspect, a method of updating a counter in a counter architecture is provided. The counter architecture includes a hierarchy of levels of statistically multiplexed counters. The method includes determining whether a corresponding row of the counter in a current level of the hierarchy of levels overflows. In some embodiments, the current level is the lowest level in the hierarchy of levels.

The method includes, based on the determination that the corresponding row in the current level does not overflow, processing each level below the current level by using a first routine and processing the current level by using a second routine. In some embodiments, the first routine includes incrementing the counter in the corresponding level and shrinking the counter in the corresponding level. In some embodiments, the second routine includes incrementing the counter in the corresponding level, wherein a size of the counter in the corresponding level is expanded if necessary.

The method includes, based on the determination that the corresponding row in the current level does overflow, determining whether a corresponding row of the counter in a next level above overflows.

The method includes, based on the determination that the corresponding row of the counter in the next level above does not overflow, processing each level below the next level above by using the first routine and processing the next level above by using the second routine. Again, the first routine includes incrementing the counter in the corresponding level and shrinking the counter in the corresponding level; and, the second routine includes incrementing the counter in the corresponding level, wherein a size of the counter in the corresponding level is expanded if necessary.

The method includes, based on the determination that the corresponding row of the counter in the next level above does overflow, when the next level above is not the highest level in the hierarchy of levels, returning to the step of determining whether a corresponding row of the counter in a next level above overflow; otherwise, when the next level above is the highest level in the hierarchy of levels, processing the next level above and each level below the next level above by using the first routine and updating an overflow queue. Again, the first routine includes incrementing the counter in the corresponding level and shrinking the counter in the corresponding level. In some embodiments, the overflow queue updated by pushing a counter identifier of the counter and an overflow width into the overflow queue.

In some embodiments, the method also includes processing data in the overflow queue, identifying a wrap-around counter by the data in the overflow queue, reading a value stored of the identified counter in each level, and clearing the identified counter in each level.

In yet another aspect, a method of updating a counter in a counter architecture is provided. The counter architecture includes a hierarchy of levels of statistically multiplexed counters. The method includes, upon occurrence of a first event, continuously processing each level below the highest level of the hierarchy by using a first routine and processing the highest level of the hierarchy by using a second routine. The method also includes, upon occurrence of a second event, continuously processing each level including and below the highest level of the hierarchy by the first routine and updating an overflow queue.

In some embodiments, the first event is there is a row overflow in each level below the highest level of the hierarchy but no row overflow in the highest level of the hierarchy. In some embodiments, the second event is there is a row overflow in each level including and below the highest level of the hierarchy.

In some embodiments, the first routine includes incrementing the counter in the corresponding level and shrinking the counter in the corresponding level. In some embodiments, the second routine includes incrementing the counter in the corresponding level. In some embodiments, the incrementing the counter includes expanding a size of the counter in the corresponding level.

In some embodiments, updating the overflow queue includes pushing a counter identifier of the counter and an overflow width into the overflow queue.

In yet another aspect, a network device is provided. The network device includes a common memory pool, wherein memories from the common memory pool are separated into a plurality of banks.

The network device also includes a counter architecture for extending counter life. The counter architecture includes a hierarchy of levels of statistically multiplexed counters. Each of the levels of statistically multiplexed counters includes N counters. In some embodiments, the N counters are stored in an on-chip SRAM memory, using the plurality of banks of memory. The N counters are arranged in N/P rows. Each of the N/P rows includes P base counters and S subcounters, wherein any of the P base counters can be dynamically concatenated with one or more of the S subcounters to flexibly extend the counting capacity.

In some embodiments, counters in the same row in one level of the hierarchy of levels are shuffled into different rows in a next level above of the hierarchy of levels. A randomization of the shuffle is a bit reverse of a counter identifier of a counter, a hash function or a bit arrangement in another order.

In some embodiments, the counter architecture further includes a mirrored shift logic to extend the P counters to a full width such that a full range of shifting is reduced.

In some embodiments, the counter architecture is configured to update a counter. The counter architecture is configured to determine whether a corresponding row of the counter in a current level of the hierarchy of levels overflows.

The counter architecture is configured to, based on the determination that the corresponding row in the current level does not overflow, process each level below the current level by using a first routine and process the current level by using a second routine. In some embodiments, the first routine includes incrementing the counter in the corresponding level and shrinking the counter in the corresponding level. In some embodiments, the second routine includes incrementing the counter in the corresponding level, wherein a size of the counter in the corresponding level is expanded if necessary.

The counter architecture is configured to, based on the determination that the corresponding row in the current level does overflow, determine whether a corresponding row of the counter in a next level above overflows.

The counter architecture is configured to, based on the determination that the corresponding row of the counter in the next level above does not overflow, process each level below the next level above by using the first routine and process the next level above by using the second routine. Again, the first routine includes incrementing the counter in the corresponding level and shrinking the counter in the corresponding level; and, the second routine includes incrementing the counter in the corresponding level, wherein a size of the counter in the corresponding level is expanded if necessary.

The counter architecture is configured to, based on the determination that the corresponding row of the counter in the next level above does overflow, when the next level above is not the highest level in the hierarchy of levels, return to the step of determining whether a corresponding row of the counter in a next level above overflow; otherwise, when the next level above is the highest level in the hierarchy of levels, process the next level above and each level below the next level above by using the first routine and update an overflow queue. Again, the first routine includes incrementing the counter in the corresponding level and shrinking the counter in the corresponding level. In some embodiments, the overflow queue updated by pushing a counter identifier of the counter and an overflow width into the overflow queue. In some embodiments, the overflow queue is shared by the N counters in the highest level in the hierarchy of levels.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

In the following description, numerous details are set forth for purposes of explanation. However, one of ordinary skill in the art will realize that the invention can be practiced without the use of these specific details. Thus, the present invention is not intended to be limited to the embodiments shown but is to be accorded the widest scope consistent with the principles and features described herein.

Embodiments of the present invention relate to an architecture that uses hierarchical statistically multiplexed counters to extend counter life by orders of magnitude. Each level includes statistically multiplexed counters. The statistically multiplexed counters includes P base counters and S subcounters, wherein the S subcounters are dynamically concatenated with the P base counters. When a row overflow in a level occurs, counters in a next level above are used to extend counter life. The hierarchical statistically multiplexed counters can be used with an overflow FIFO to further extend counter life.

Figure 1:
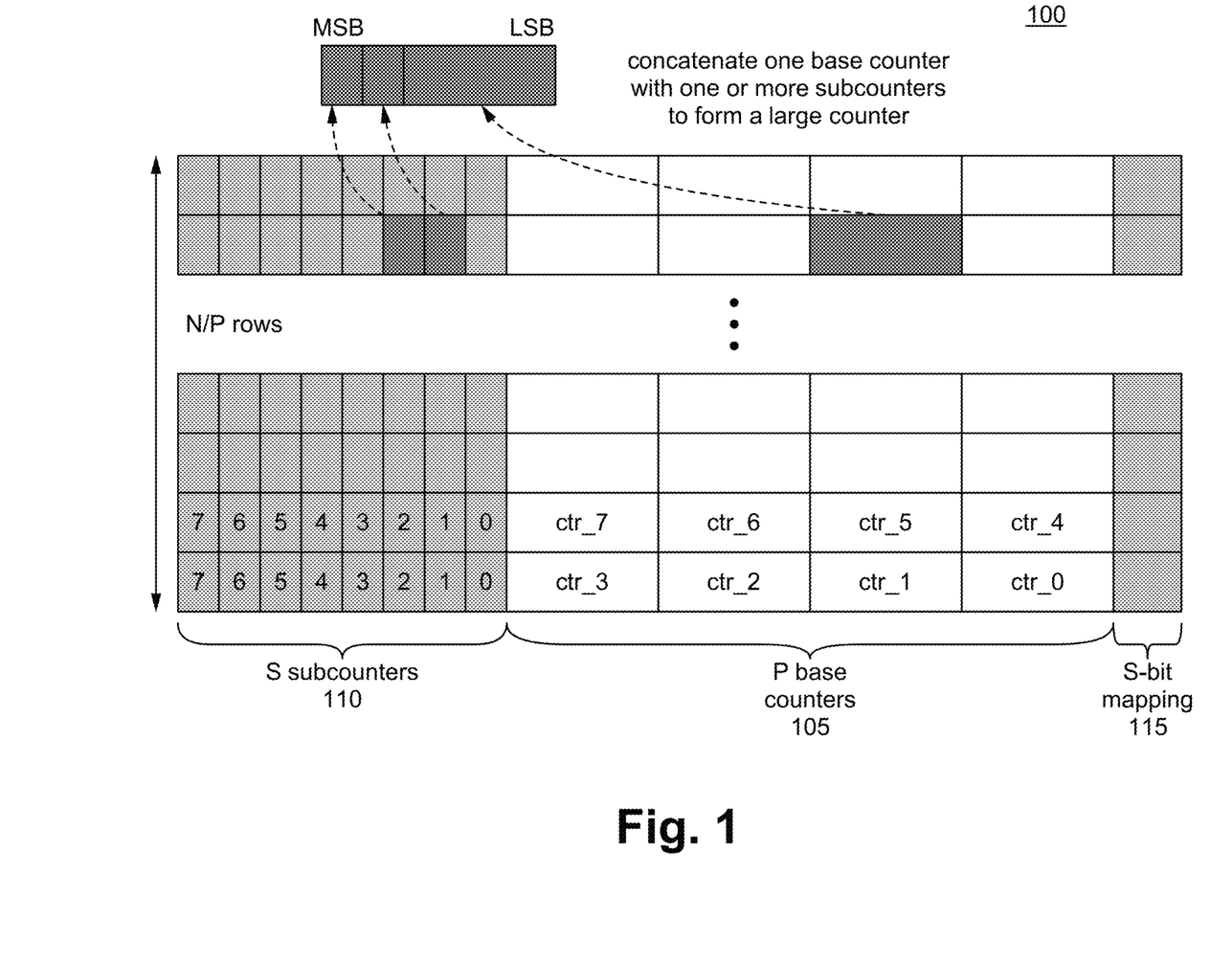
FIG. 1 illustrates a block diagram of statistically multiplexed counters in accordance with some embodiments of the present invention.

FIG. 1 illustrates a block diagram of statistically multiplexed counters 100 in accordance with some embodiments of the present invention. In some embodiments, the counters are arranged in N/P rows, where N is a number of total counters and P is a number of base counters in each row. In FIG. 1, base counters are identified as ctr_n. Typically, each of the N counters is associated with a unique counter identifier. P is typically chosen as a power of two for optimal implementation.

Each row includes P base counters 105, S subcounters (or bricks) 110 and an overhead 115. The overhead is an S-bit mapping 115 of the S subcounters to the P base counters. The S-bit mapping 115 is updated when counters are expanded or shrunk. Counter expansion and shrinkage are discussed below. The terms subcounters and bricks are used interchangeably herein.

The P base counters 105 in each row share a set of memory bits, which is evenly shared among the P base counters 105. Each of those P base counters 105 is of a fixed size. Similarly, the S subcounters 110 in each row share a set of memory bits, which is evenly shared among the S subcounters 110. Each of those S subcounters 110 is of a fixed size. Each base counters is concatenated with at least one subcounter. As needed, any of the P base counters 105 can be dynamically concatenated with one or more of the corresponding S subcounters 110 to flexibly extend the counting capacity. For example, a two-bit counter can count four values. By adding an additional bit to the counter, the counter, now being a three-bit counter, can count eight values, doubling the counting capacity. A counter can thus be expanded by concatenating one or more subcounters to a base counter. And, briefly, a counter can be shrunken by removing one or more subcounters.

In FIG. 1, P=4 and S=8 in each row, although other values are possible. In some embodiments, each of the P base counters 105 initially uses one subcounter 110. There are thus four bricks 110 that are initially free or unallocated in each row. As the P base counters 105 grow, the four remaining free bricks 110 are dynamically allocated to any of the P base counters 105 that needs to expand its counting capacity.

A row overflow occurs when one of the P counters in a row is incremented, requiring bricks to expand to avoid counter overflow, but there are no longer any available bricks to expand with.

By the law of large numbers, when P is large enough, the expected total width of the P base counters 105 will be fairly close to $\log_2(EPS*T/N)*P$, where EPS is events per second and T is timing interval. In particular, EPS*T is the expected total events count during T, and EPS*T/N is the average loading per counter. In some embodiments, EPS is packets per second. In some embodiments, EPS is bytes per second.

Getting P statistically large enough, however, is dauntingly challenging to implement in hardware. An architecture of hierarchical statistically multiplexed counters addresses this problem.

Figure 2A:
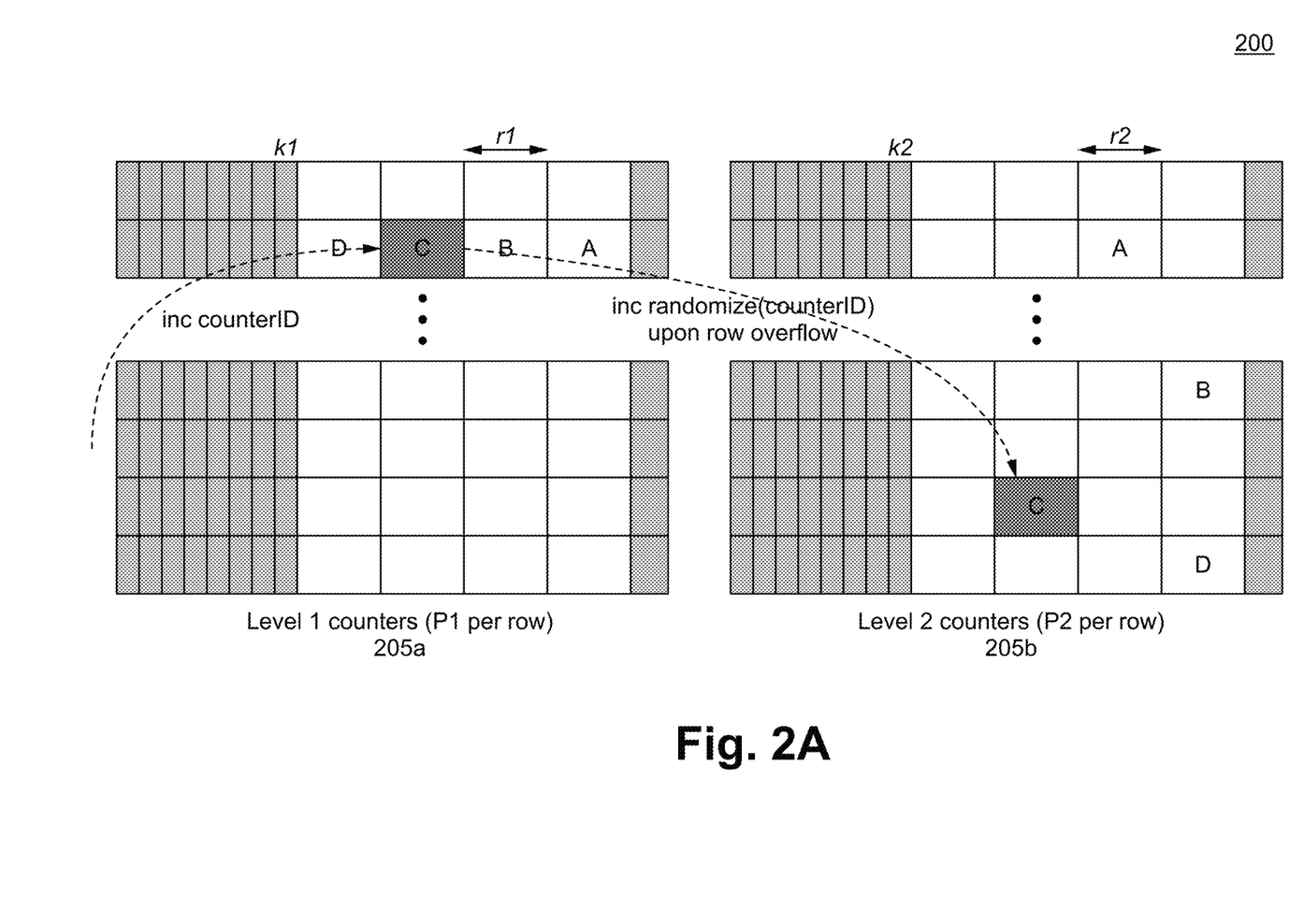
FIG. 2A illustrates a block diagram of hierarchical statistically multiplexed counters in accordance with some embodiments of the present invention.

FIG. 2A illustrates a block diagram of hierarchical statistically multiplexed counters 200 in accordance with some embodiments of the present invention. The hierarchical statistically multiplexed counters 200 includes a plurality of levels of statistically multiplexed counters 205a, 205b (collectively, 205). Each of the plurality of levels of statistically multiplexed counters 205 is similarly configured as the above-described statistically multiplexed counters 100.

In FIG. 2A, the hierarchical statistically multiplexed counters 200 includes two levels: level 1 counters 205a and level 2 counter 205b. The hierarchical statistically multiplexed counters 200 can include more than two levels, but each level adds to the overhead of the mapping bits.

There can be the same or different number of counters on each level 205. Within each level 205, the width of each subcounter is the same and the width of each base counter is the same. However, widths of subcounters across levels 205 can be the same or different. Similarly, widths of base counters across levels 205 can be same or different. In FIG. 2, each level 1 base counter is r1 bits wide, each level 1 subcounter is k1 bits wide, each level 2 base counter is r2 bits wide and each level 2 subcounter is k2 bits wide.

When a row overflow occurs in level 1, counters in level 2 are used. For example, an event comes in to the level 1 counter C. Assume the level 1 counter C overflows unless another brick is assigned to the level 1 counter C. However, if there are no available bricks left in the corresponding row, then the level 1 counter C will wrap around and a count is added to the level 2 counter C.

In some embodiments, the counters in the same row in level 1 are shuffled into different rows in level 2, as shown in FIG. 2A. In some embodiments, P1*P2 counters are statistically multiplexed. A randomization of the shuffle can be a bit reverse of the counter identifier of a counter. Alternatively, a randomization of the shuffle can be based on a hash function. Alternatively, a randomization of the shuffle is a bit arrangement in another order. Assuming no row overflow occurs in level 2, the total count for counter C is level_2_ctr*$2^{(r1+k1)}$+level_1_ctr, wherein level_1_ctr and level_2_ctr are the values of the level 1 counter C and the level 2 counter C, respectively.

Figure 2B:
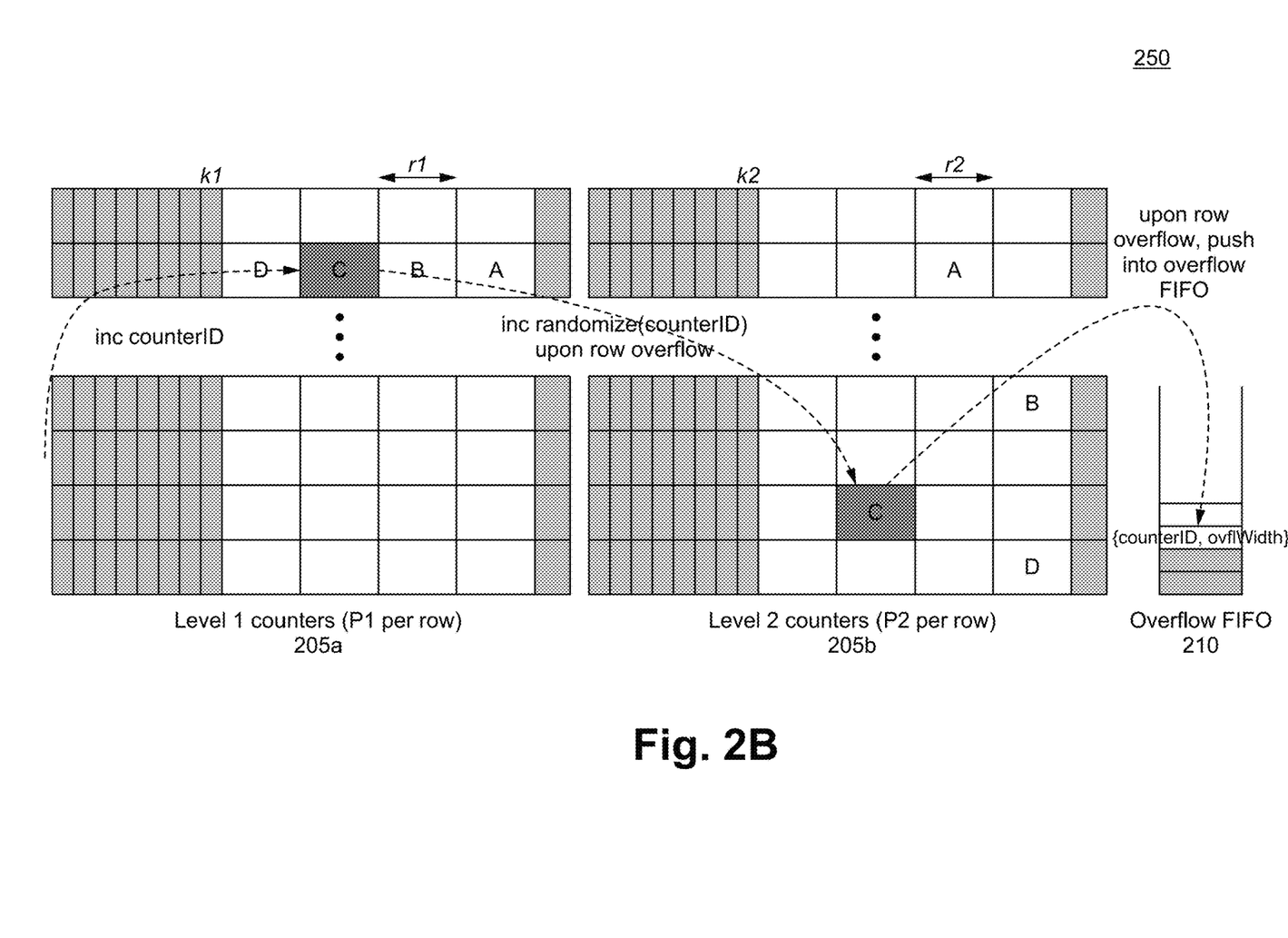
FIG. 2B illustrates a block diagram of hierarchical statistically multiplexed counters with an overflow FIFO in accordance with some embodiments of the present invention.

The hierarchical statistically multiplexed counters 200 can be used with an overflow FIFO 210, as illustrated in FIG. 2B. An exemplary overflow FIFO is discussed in U.S. patent application Ser. No. 14/302,343, entitled "Counter with Overflow FIFO and a Method Thereof," filed Jun. 11, 2014, which is hereby incorporated by reference in its entirety. When a row overflows in the highest level in the hierarchy of levels, the overflow FIFO 210 is used. The overflow FIFO 210 can be stored in SRAM. Alternatively, the overflow FIFO 210 is fixed function hardware. The overflow FIFO 210 is typically shared and used by all N counters in the highest level.

When rows start to overflow in the highest level (e.g., level 2 in FIG. 2B), the overflow FIFO 210 will store the associated counter identifiers of all counters that are overflowing. Typically, as soon as any of the level 2 counters 205b starts overflowing, the associated counter identification of an overflowed counter and an overflow width are pushed into the overflow FIFO 210. An interrupt is sent to a CPU to read the overflow FIFO 210 and to read and to reset or clear the overflowed counter (e.g., counter C in FIG. 2B) in each level.

Figure 3A:
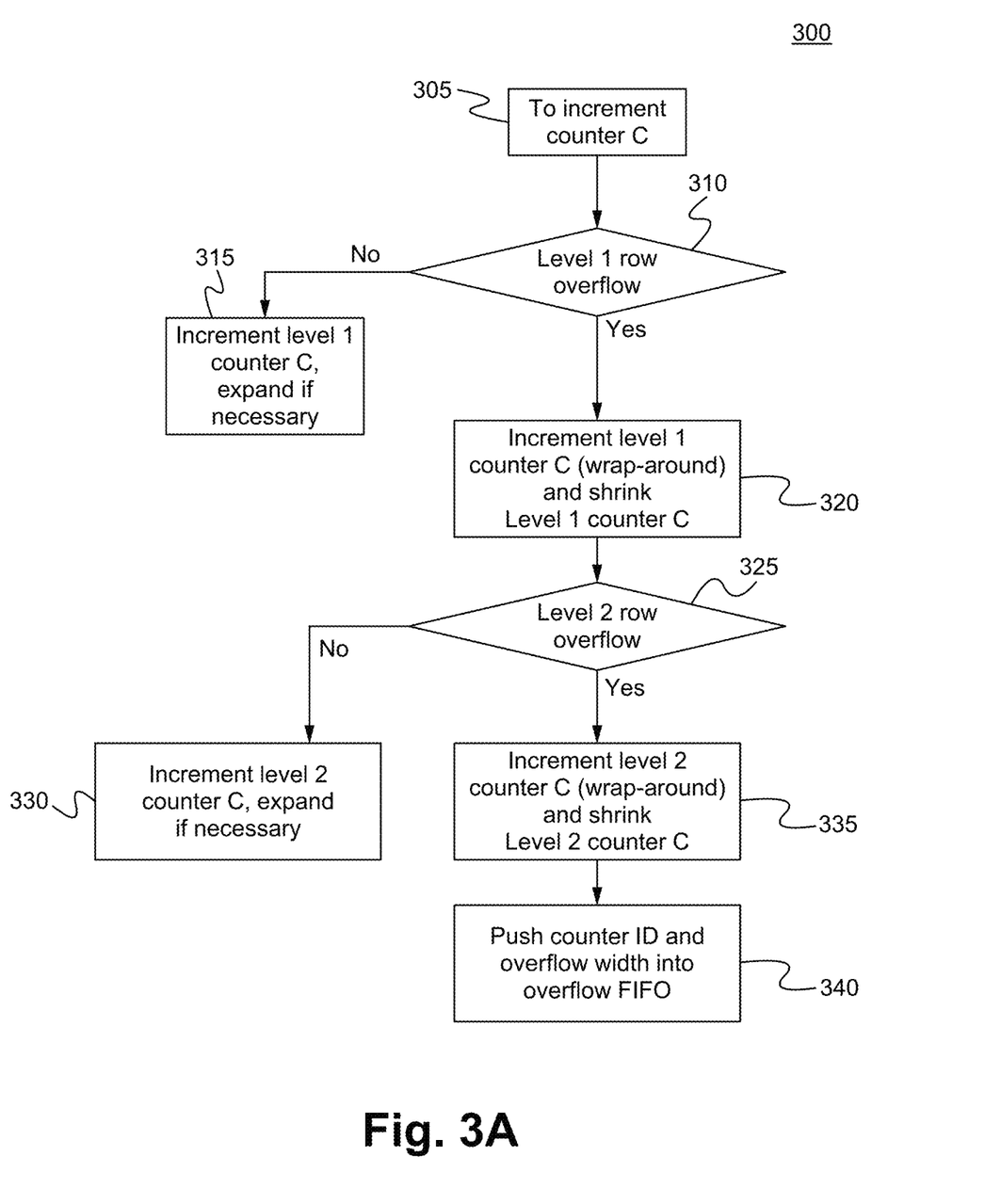
FIGS. 3A-3B illustrate flow diagrams of updating a counter in accordance with some embodiments of the present invention.

FIG. 3A illustrates a flow diagram 300 of updating a counter in accordance with some embodiments of the present invention. Assume the hierarchical statistically multiplexed counters includes two levels. Further assume counter C includes a current value of init_value and is to be updated with a value of B, which can result in no overflows, a level 1 overflow, or both a level 1 overflow and a level 2 overflow.

Counter C is to be incremented with value B (step 305). It is determined whether there is a level 1 row overflow of the row that counter C is in (step 310). If it is determined that there is no level 1 row overflow at the step 310, then the level 1 counter C is incremented (step 315). The level 1 counter C is expanded by concatenating with another available subcounter if necessary. And, the counter update process is done. After updating, the level 1 counter value is level_1_init_value+B.

On the other hand, if it is determined that there is a level 1 row overflow at the step 310, then the level 1 counter C is incremented with a wrap around and is shrunk if it is initially using more than one subcounter (step 320). When a counter is shrunk, one or more subcounters are freed up for reallocation. The shrinkage enables other counters in the same row to extend themselves or that counter to adapt itself.

Then, it is determined if there is a level 2 row overflow of the row that counter C is in (step 325). If it is determined that there is no level 2 row overflow at the step 325, then the level 2 counter C is incremented (step 330). The level 2 counter C is expanded by concatenating with another available subcounter if necessary.

On the other hand, if it is determined that there is a level 2 row overflow at the step 325, then the level 2 counter C is incremented with a wrap around and is shrunk by removing one or more subcounters (step 335). The counter identifier of counter C and the overflow width are pushed into the overflow FIFO (step 340).

After updating the counter, the level 1 counter value is (level_1_init_value+B) % $2^{(r1+k1)}$. If there is no level 2 overflow, then the level 2 counter value is level_2_init_value+(level_1_init_value+B)»(r1+k1). If there is a level 2 overflow, then the level 2 counter value is (level_2_init_value+(level_1_init_value+B)»(r1+k1))% $2^{(r2+k2)}$, while the counter identifier of the overflowed counter and the overflow width are pushed into the overflow FIFO.

Figure 3B:
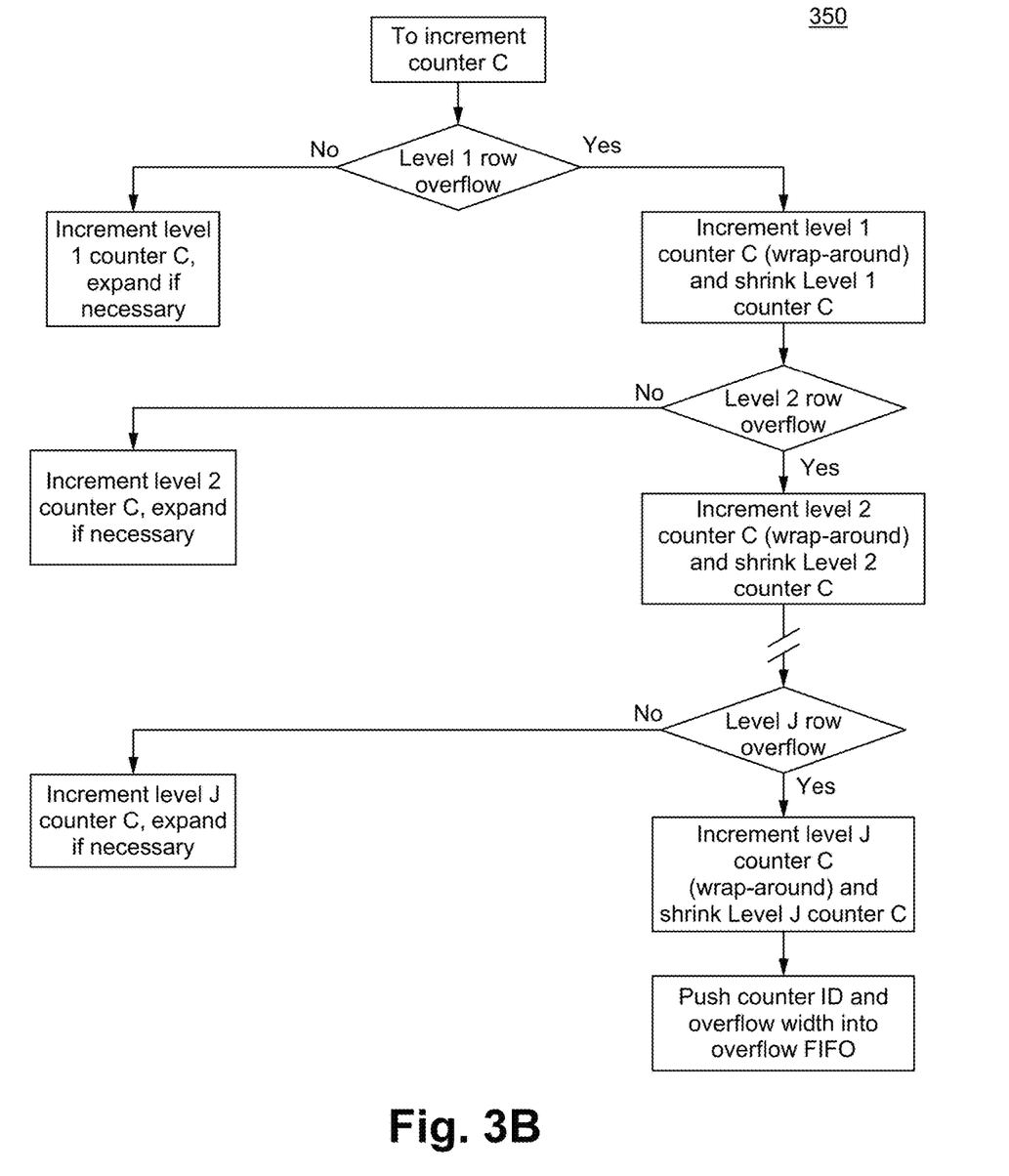

It should be noted that the procedure of updating a counter a hierarchy of more than two levels is similar to the procedure illustrated in FIG. 3A. For example, FIG. 3B illustrates a flow diagram 350 of updating a counter in a hierarchy of J levels.

Figure 4:
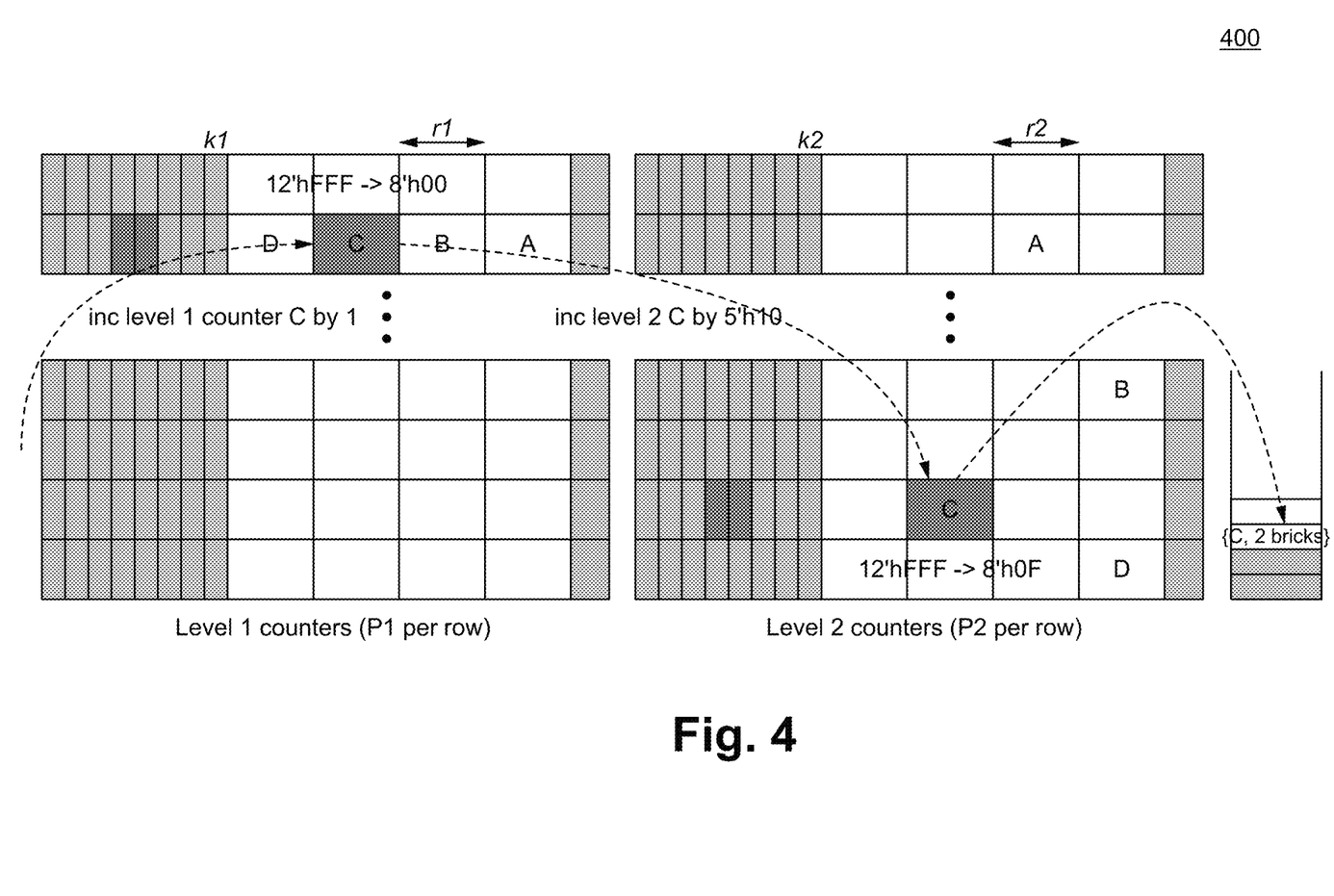
FIG. 4 illustrates a counter update example in accordance with some embodiments of the present invention.

FIG. 4 illustrates a counter update example 400 in accordance with some embodiments of the present invention. Assume the hierarchical statistically multiplexed counters include two levels. Further assume r1=k1=r2=k2=4 and counter C is to be incremented by 1. Initially, the level 1 counter C uses two bricks, with an initial value of 12'hFFF, and the level 2 counter C uses two bricks, with an initial value of 12'hFFF, with other bricks in the same row already utilized (i.e., not available). The initial value of counter C is 12'hFFF*$2^8$+12'hFFF='h100EFF. After the update, the value of counter C should be 'h100F00.

During the update, the level 1 counter C needs three bricks since the value of 13'h1000 (=12'hFFF+1) needs to be stored, but the level 1 counter C cannot be expanded. As such, level 1 row overflow occurs. The level 1 counter C wraps around and shrinks to one brick, leaving 8'h00. A value of 5'h10 (=13'h1000»(4+4)) needs to be added to the level 2 counter C.

The level 2 counter C needs three bricks since the value of 13'h100F (=12'hFFF+5'h10) needs to be stored, but the level 2 counter C cannot be expanded. As such, level 2 row overflow occurs. The level 2 counter C wraps around and shrinks to one brick, leaving 8'h0F, while the counter identifier of counter C and the overflow width of 12 bits is pushed to the overflow FIFO.

The final counter value can be reconstructed as: overflow FIFO value+level 2 value+level 1 value. The overflow FIFO value is $sum[2^{(r1+k1+overflow\_width)}]$ for all occurrences of the counter identification in the overflow FIFO. The level 2 value is $level\_2\_ctr*2^{(r1+k1)}$, where level_2_ctr is the value of the level 2 counter. The level 1 value is level_1_ctr, which is the value of the level 1 counter. In the example 400, the final counter value of counter C is $(1-entry*2^{12}+8'h0F)*2^8+8'h00='h100F00$.

As discussed above, the overhead in each row includes a S-bit mapping of subcounters to base counters. Continuing with the example above, since there are 8 subcounters, a 8-bit mapping is used. Assume the S-bit mapping is 8'b10010101, where a "1" in the mapping delimits counter boundary. The 8'b10010101 mapping indicates that the base counter ctr_0 is associated with subcounter 0 (based on 0' bit in the mapping), the base counter ctr_1 is associated with subcounter 1 and subcounter 2 (based on $1^{st}$ and $2^{nd}$ bits in the mapping), the base counter ctr_2 is associated with subcounter 3 and subcounter 4 (based on $3^{rd}$ and $4^{th}$ bits in the mapping), and the base counter ctr_3 is associated with subcounter 5, subcounter 6 and subcounter 7 (based on $5^{th}$, $6^{th}$ and $7^{th}$ bits in the mapping). The 8'b10010101 mapping indicates the amount shifting of each subcounter. Based on this shifting, the $7^{th}$ bit (or $75^{th}$ subcounter) can potentially be shifted a lot, which is hardware intensive. In some embodiments, to minimize the amount of shifting, a shifting and twisting technique is used.

Figure 5:
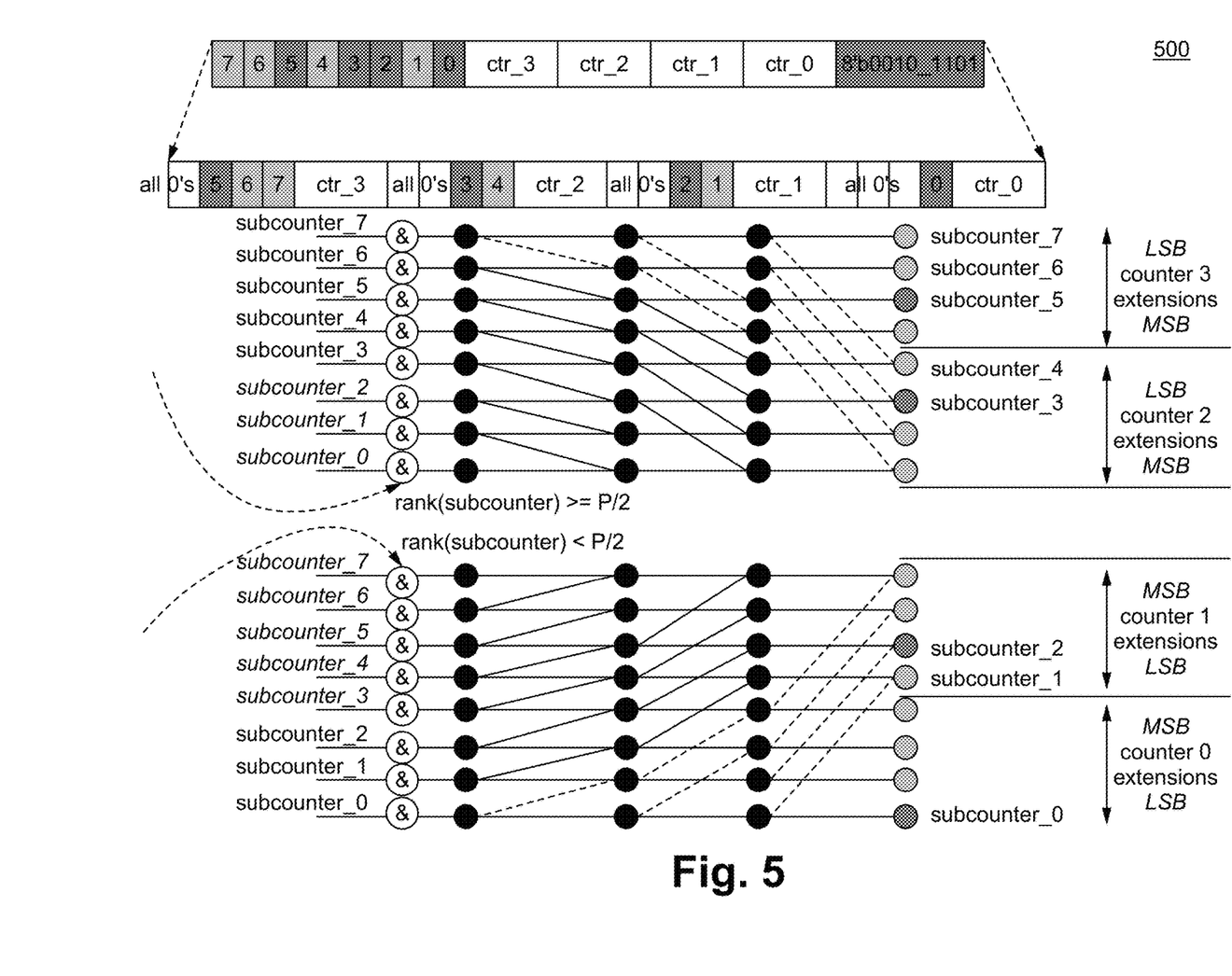
FIG. 5 illustrates an example of mapping subcounters to base counters in accordance with some embodiments of the present invention.

FIG. 5 illustrates an example 500 of mapping subcounters to base counters in accordance with some embodiments of the present invention. To be hardware friendly, a restriction is placed on how the subcounters are mapped to the base counters. In some embodiments, the restriction is that each base counter is assigned at least one subcounter but no more than a predetermined number of subcounters. In some embodiments, each base counter is assigned q subcounters, where $1 \leq q \leq 4$. As such, a second mechanism of row overflow is introduced, when a counter needs to be expanded beyond the maximum allowed number of subcounters.

A shift network includes a lower shift network and an upper shift network. The base counters are divided between the lower shift network and the upper shift network. Typically, the lower base counters are associated with the lower shift network to shift the subcounters up. Typically, the upper base counters are associated with the upper shift network to shift the subcounters down. A subcounter is typically shifted up if its rank is less than P/2, and a subcounter is typically shifted down if its rank is greater than or equal to P/2.

Using the shift and twist technique, the S-bit mapping is rather 8'0010_1101, as shown in FIG. 5. The S-bit mapping is read from the right for lower P/2 base counters and is read from the left for the upper P/2 base counters. "1" in the mapping delimits counter boundary. With the reading from right, the $0^{th}$ bit in this mapping indicates that subcounter 0 is mapped to base counter ctr_0. The $2^{nd}$ bit in this mapping indicates that subcounters 1 and 2 are mapped to base counter ctr_1. Since there are already two counters, for the other (upper) two counters, the reading is from the left. With the reading from the left, the $3^{rd}$ bit in this mapping indicates that subcounter 3 and subcounter 4 are mapped to base counter ctr_2. The $5^{th}$ bit in this mapping indicates that subcounters 5, 6 and 7 are mapped to base counter ctr_3. Based on this technique, the counters are extended to full width such that the full range of shifting is reduced. In example 500, an entire layer of shifting is eliminated by mirroring the shift logic.

A subcounter is associated with the lower shift network if its rank is less than P/2, and a subcounter is associated with the upper shift network if its rank is z P/2. The lower shift network shifts lower subcounter i up by 4*rank(i)+dist(i)−i, where rank(i) is the number of 1's, starting from the least significant bit, in the lower bits, and dist(i) is the number of 0's since the last bit of 1 from the lower bits. For example, subcounter 0 is mapped to base ctr_0 (4*0+0−0=0, which corresponds to the base counter 0 extensions), subcounter 1 is mapped to base ctr_1 (4*1+0−1=3, which corresponds to the base counter 1 extensions), and subcounter 2 is mapped to base ctr_1 (4*1+1−2=3, which corresponds to the base counter 1 extensions).

The upper shift network shifts upper subcounter i down by a slightly different equation, namely 4*reverse_rank(i)+reverse_dist(i)−(S−1−i), wherein reverse_rank(i) is the number of 1's, starting from the most significant bit, in the upper bits, and reverse_dist(i) is the number of 0's since the last bit of 1 from the upper bits. For example, subcounter 3 is mapped to base ctr_2 (4*1+1−4=1, which corresponds to the base counter 2 extensions), subcounter 4 is mapped to base ctr_2 (4*1+0−3=1, which corresponds to the base counter 2 extensions), subcounter 5 is mapped to base ctr_3 (4*0+2−2=0, which corresponds to the base counter 3 extensions), subcounter 6 is mapped to base ctr_3 (4*0+1−1=0, which corresponds to the base counter 3 extensions), and subcounter 7 is mapped to base ctr_3 (4*0+0−0=0, which corresponds to the base counter 3 extensions). Note that the upper shift network mirrors significance of subcounters versus the lower shift network. In this example, subcounter_7 is applied to least significant position of all counter 3 extensions and subcounter_5 is applied to most significant position of all counter 3 extensions.

As illustrated in FIG. 5, without "twisting," the hardware is more complex. With twisting, shifting is reduced by half. In some embodiments, at least one layer of shifting is eliminated. Hardware shifting is improved by aligning at both ends and expanding towards the center. Further, as illustrated in FIG. 5, the dotted lines are always inactive and can be further optimized, thereby reducing hardware implementation cost.

By allocating on average D-bit of storage space per counter, excluding overhead of mapping, the expected loading per counter is $EPS*T/N=2^D$, where EPS is events per second. The expected CPU read interval is $T=2^D*N/EPS$. For numerical comparisons, assume EPS is 654.8 MPPS, N=16k counters are stored in an on-chip SRAM memory using two banks of memory, where each analytics bank has 17 KB memory. Further assume P1=P2=16 and S1=S2=24. Based on these assumptions, (case 1) using a 17-bit fixed width counter with no overflow FIFO, the CPU read interval is 0.2 ms-1 ms; (case 2) using a 17-bit fixed width counter with 16-deep overflow FIFO, the CPU read interval is 3.2 ms, which is better than case 1 by more than an order of magnitude; and, (case 3) using statistically multiplexed counters, without considering the effect of an overflow FIFO, the CPU read interval is ~0.41 seconds, which is better than case 2 by more than two orders of magnitude.

To implement 256K packet counters using 32 memory banks with three level statistically multiplexed counters, the CPU read interval is ~2.32 seconds. Coupling the three level statistically multiplexed counters with an overflow FIFO, the CPU read interval is on the order of one minute.

Figure 6:
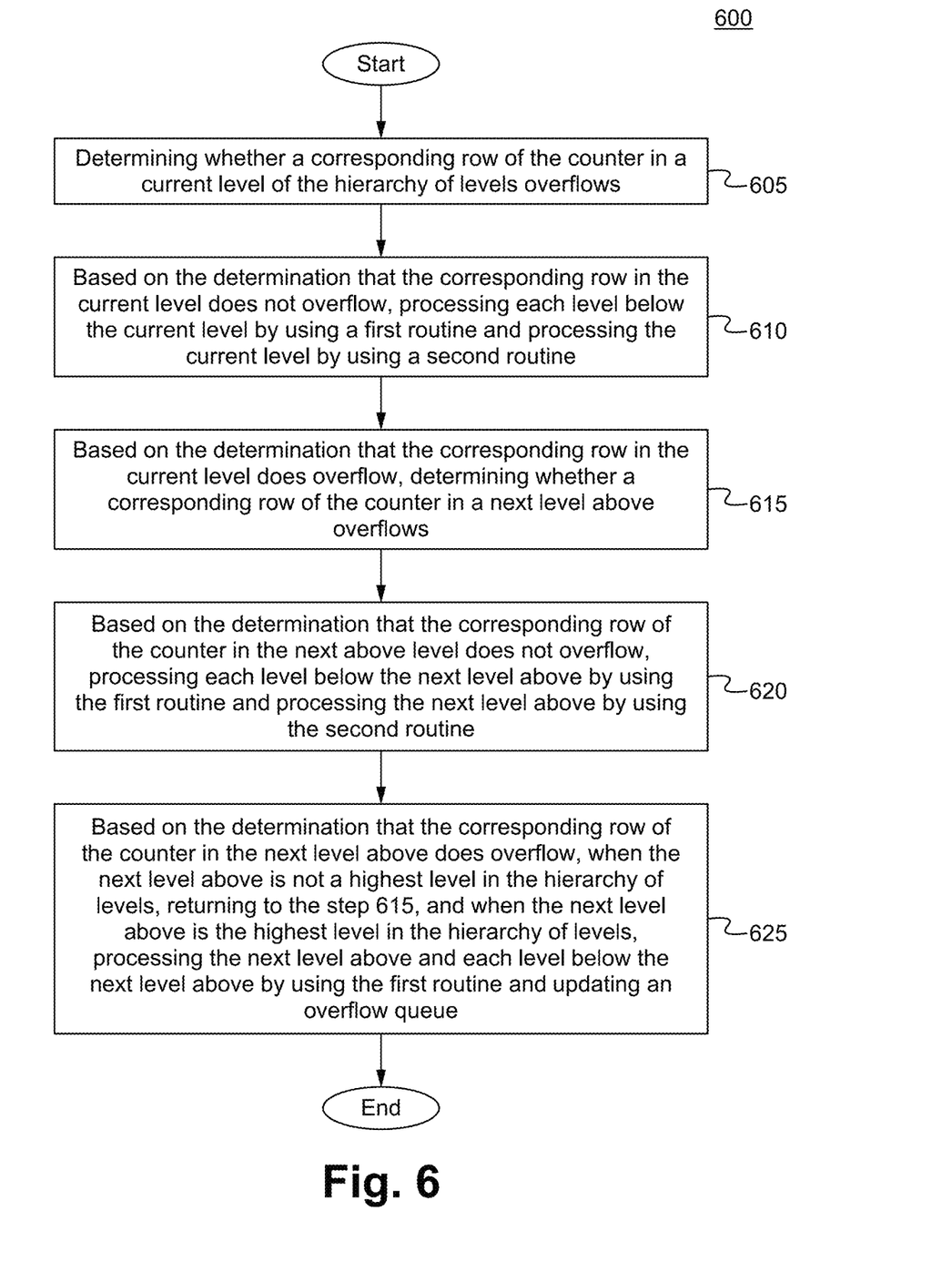
FIG. 6 illustrates a method of updating a counter in a counter architecture in accordance with some embodiments of the present invention.

FIG. 6 illustrates a method of updating a counter in a counter architecture 600 in accordance with some embodiments of the present invention. The counter architecture includes a hierarchy of levels of statistically multiplexed counters. At a step 605, it is determined whether a corresponding row of the counter in a current level of the hierarchy of levels overflows. In some embodiments, the current level is the lowest level in the hierarchy of levels.

At a step 610, based on the determination that the corresponding row in the current level does not overflow, each level below the current level is processed by using a first routine and the current level is processed by using a second routine. In some embodiments, the first routine includes incrementing the counter in the corresponding level and shrinking the counter in the corresponding level. In some embodiments, the second routine includes incrementing the counter in the corresponding level, wherein a size of the counter in the corresponding level is expanded if necessary.

At a step 615, based on the determination that the corresponding row in the current level does overflow, it is determined whether a corresponding row of the counter in a next level above overflows.

At a step 620, based on the determination that the corresponding row of the counter in the next level above does not overflow, each level below the next level above is processed by using the first routine and the next level above is processed by using the second routine. Again, the first routine includes incrementing the counter in the corresponding level and shrinking the counter in the corresponding level; and, the second routine includes incrementing the counter in the corresponding level, wherein a size of the counter in the corresponding level is expanded if necessary.

At a step 625, based on the determination that the corresponding row of the counter in the next level above does overflow, when the next level above is not the highest level in the hierarchy of levels, steps, starting from the step 615, are repeated; otherwise, when the next level above is the highest level in the hierarchy of levels, the next level above and each level below the next level above is processed by using the first routine and an overflow queue is updated. Again, the first routine includes incrementing the counter in the corresponding level and shrinking the counter in the corresponding level. In some embodiments, the overflow queue updated by pushing a counter identifier of the counter and an overflow width into the overflow queue.

An interrupt is sent to the CPU to read data at in the overflow queue for processing. A wrap-around counter is identified by the data in the overflow queue. A value stored of the identified counter in each level is read and cleared. Based on these values, a final counter value can be calculated.

Figure 7:
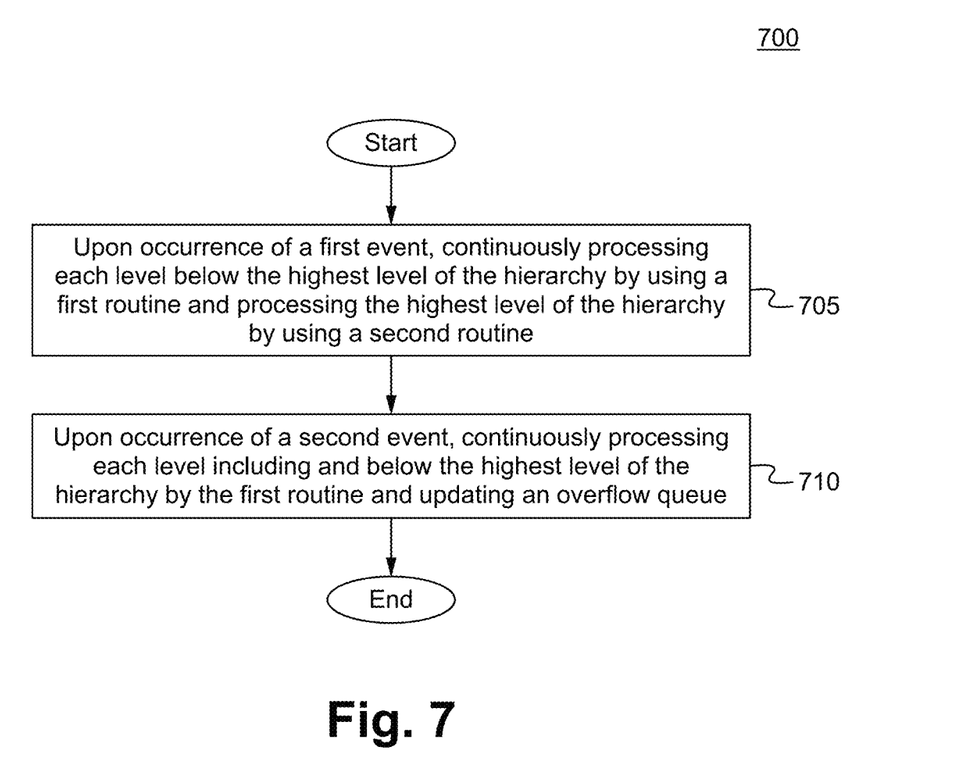
FIG. 7 illustrates another method of updating the counter in the counter architecture in accordance with some embodiments of the present invention.

FIG. 7 illustrates another method of updating the counter in the counter architecture 700 in accordance with some embodiments of the present invention. At a step 705, upon occurrence of a first event, each level below the highest level of the hierarchy is continuously processed by using a first routine and the highest level of the hierarchy is processed by using a second routine. In some embodiments, the first event is a row overflow in each level below the highest level of the hierarchy but no row overflow in the highest level of the hierarchy.

In some embodiments, the first routine includes incrementing the counter in the corresponding level and shrinking the counter in the corresponding level. In some embodiments, the second routine includes incrementing the counter in the corresponding level. In some embodiments, the incrementing the counter includes expanding a size of the counter in the corresponding level.

At a step 710, upon occurrence of a second event, each level including and below the highest level of the hierarchy is continuously processed by the first routine and an overflow queue is updated. In some embodiments, the second event is a row overflow in each level including and below the highest level of the hierarchy. Again, the first routine includes incrementing the counter in the corresponding level and shrinking the counter in the corresponding level. In some embodiments, the overflow queue is updated by pushing a counter identifier of the counter and an overflow width into the overflow queue.

The counter architecture, which includes hierarchical statistically multiplexed counters and an overflow FIFO, is typically implemented in a high speed network device, such as a network switch. In some embodiments, the counters are stored in an on-chip SRAM memory, using two banks of memory. Exemplary counters and memory banks are discussed in U.S. patent application Ser. No. 14/289,533, entitled "Method and Apparatus for Flexible and Efficient Analytics in a Network Switch," filed May 28, 2014, which is hereby incorporated by reference in its entirety. This counter architecture is able to advantageously extend counter life by orders of magnitude, as illustrated in the above comparisons.

One of ordinary skill in the art will realize other uses and advantages also exist. While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

We claim:

1. A counter architecture implemented in a network device, the counter architecture comprising:
   a mirrored shift logic; and
   a hierarchy of levels of statistically multiplexed counters, wherein each level of the hierarchy of levels includes N counters arranged in rows having P base counters, and further wherein the mirrored shift logic extends the P base counters to a full width such that a full range of shifting is reduced.

2. The network device of claim 1, wherein counters in the same row in one level of the hierarchy of levels are shuffled into different rows in a next level above of the hierarchy of levels.

3. The network device of claim 2, wherein a randomization of the shuffle is a bit reverse of a counter identifier of a counter, a hash function or a bit arrangement in another order.

4. The network device of claim 1, wherein the counter architecture is configured to update a counter by:
   determining whether a corresponding row of the counter in a current level of the hierarchy of levels overflows;
   based on the determination that the corresponding row in the current level does not overflow, processing each level below the current level by using a first routine and processing the current level by using a second routine; and
   based on the determination that the corresponding row in the current level does overflow, determining whether a corresponding row of the counter in a next level above overflows;

based on the determination that the corresponding row of the counter in the next level above does not overflow, processing each level below the next level above by using the first routine and processing the next level above by using the second routine; and based on the determination that the corresponding row of the counter in the next level above does overflow, when the next level above is not the highest level in the hierarchy of levels, returning to the step of determining whether a corresponding row of the counter in a next level above overflows, and when the next level above is the highest level in the hierarchy of levels, processing the next level above and each level below the next level above by using the first routine and updating an overflow queue.

5. The network device of claim 4, wherein the first routine includes incrementing the counter in the corresponding level and shrinking the counter in the corresponding level.

6. The network device of claim 4, wherein the second routine includes incrementing the counter in the corresponding level.

7. The network device of claim 6, wherein the incrementing the counter includes expanding a size of the counter in the corresponding level.

8. The network device of claim 4, wherein updating the overflow queue includes pushing a counter identifier of the counter and an overflow width into the overflow queue.

9. The network device of claim 4, wherein the overflow queue is shared by the N counters in the highest level in the hierarchy of levels.

10. The network device of claim 1, wherein the N counters are stored in an on-chip SRAM memory, using the common memory pool.

11. A non-transitory computer-readable medium storing a mirrored shift logic and a hierarchy of levels of statistically multiplexed counters, wherein each level of the hierarchy of levels includes N counters arranged in rows having P base counters, and further wherein the mirrored shift logic extends the P base counters to a full width such that a full range of shifting is reduced.

12. The medium of claim 11, wherein counters in the same row in one level of the hierarchy of levels are shuffled into different rows in a next level above of the hierarchy of levels.

13. The medium of claim 12, wherein a randomization of the shuffle is a bit reverse of a counter identifier of a counter, a hash function or a bit arrangement in another order.

14. The medium of claim 11, wherein the counter architecture is configured to update a counter by:

determining whether a corresponding row of the counter in a current level of the hierarchy of levels overflows;

based on the determination that the corresponding row in the current level does not overflow, processing each level below the current level by using a first routine and processing the current level by using a second routine; and based on the determination that the corresponding row in the current level does overflow, determining whether a corresponding row of the counter in a next level above overflows;

based on the determination that the corresponding row of the counter in the next level above does not overflow, processing each level below the next level above by using the first routine and processing the next level above by using the second routine; and based on the determination that the corresponding row of the counter in the next level above does overflow, when the next level above is not the highest level in the hierarchy of levels, returning to the step of determining whether a corresponding row of the counter in a next level above overflows, and when the next level above is the highest level in the hierarchy of levels, processing the next level above and each level below the next level above by using the first routine and updating an overflow queue.

15. The medium of claim 14, wherein the first routine includes incrementing the counter in the corresponding level and shrinking the counter in the corresponding level.

16. The medium of claim 14, wherein the second routine includes incrementing the counter in the corresponding level.

17. The medium of claim 16, wherein the incrementing the counter includes expanding a size of the counter in the corresponding level.

18. The medium of claim 14, wherein updating the overflow queue includes pushing a counter identifier of the counter and an overflow width into the overflow queue.

19. The medium of claim 14, wherein the overflow queue is shared by the N counters in the highest level in the hierarchy of levels.

20. The medium of claim 11, wherein the medium includes a static random access memory (SRAM) and the N counters are stored in the SRAM.

* * * * *